United States Patent [19]

Wakabayashi

[11] Patent Number: 5,199,048
[45] Date of Patent: Mar. 30, 1993

[54] NOISE CANCELER FOR KEYING PULSE IN CATV CONVERTER

[75] Inventor: Toshikazu Wakabayashi, Fujisawa, Japan

[73] Assignee: Matsushita Electric Industrial Co., Ltd., Osaka, Japan

[21] Appl. No.: 675,260

[22] Filed: Mar. 27, 1991

[30] Foreign Application Priority Data

Mar. 28, 1990 [JP] Japan ................................. 2-80343

[51] Int. Cl.⁵ .......................... H03K 5/05; H04B 1/12
[52] U.S. Cl. .................... 375/104; 307/234; 455/223; 455/305
[58] Field of Search ............... 375/104; 358/167, 447, 358/463; 328/162, 163, 165; 307/234, 265, 266; 455/222, 223, 304, 305

[56] References Cited

U.S. PATENT DOCUMENTS 2,905,816  9/1959  Buebel, Jr. ..................... 375/104
3,226,570 12/1965  Rosenbaum ..................... 307/234
3,244,907  4/1966  Daigle, Jr. ..................... 307/266
3,588,705  6/1971  Paine ............................. 455/223
3,898,481  8/1975  Glaser ........................... 307/234
4,053,932 10/1977  Yamaguti et al. ............... 328/165
4,311,963  1/1982  Watanabe et al. ............... 375/104
4,617,678 10/1986  Devensky et al. .............. 375/104
4,775,840 10/1988  Ohmori et al. .................. 307/234

Primary Examiner—Benedict V. Safourek
Attorney, Agent, or Firm—Wenderoth, Lind & Ponack

[57] ABSTRACT

A noise canceler for use in a CATV converter includes a keying pulse processing circuit for removing a noise signal from a keying signal. The keying pulse processing circuit includes a canceling signal generator for generating a noise canceling pulse signal, a delaying circuit for delaying the keying signal to produce a delayed signal, and a logic circuit including an AND gate for producing a noise canceled signal which is obtained by taking a logical product of the canceling pulse signal and the delayed signal. Since the noise pulse has a sufficiently small width when compared with the pulse widths of the keying signal and noise removing signal, the noise pulse is removed to obtain a noise canceled signal.

2 Claims, 4 Drawing Sheets

NOISE CANCELER FOR KEYING PULSE IN CATV CONVERTER

BACKGROUND OF THE INVENTION

1. Field of the Invention

The present invention relates to a keying pulse processing circuit and, more particularly to, a keying pulse processing circuit for use in a noise canceler for a CATV converter.

2. Description of the Prior Art

The keying signal transmitted into the keying, pulse processing circuit is a group of pulse signals having information necessary to descramble a scrambled image signal.

A conventional keying pulse processing circuit will be described with reference to the block diagram shown in FIG. 3. A keying pulse signal S1 applied from an input terminal 1 is shaped into a rectangular waveform signal S2 by a wave shaping circuit 2, and further processed into various necessary pulse signals by a pulse processing circuit 3 for use in a video system 4 and CPU 5.

However, in the above conventional set-up of the keying pulse processing circuit, when a keying signal having a noise signal is input, there has been such a problem that the keying signal is processed without removing the noise signal from the keying signal, and the processed signal is input into the next stage as a normal keying signal.

SUMMARY OF THE INVENTION

The object of the present invention is therefore to provide an imaging device which solves these problems.

In order to achieve the aforementioned objective, a noise canceler for removing noise pulses from a keying signal defined by a plurality of keying pulses comprises a signal producing means for producing a noise canceling pulse signal having a canceling pulse in response to a leading edge of the keying pulse and the noise pulse in the keying signal. The canceling pulse had a predetermined pulse width. The noise canceler further comprises a delaying means for delaying the keying signal by a predetermined time to produce a delayed pulse signal, and a canceling means for receiving the canceling signal and the delayed signal and disabaling the generation of the delayed pulse during the presence of the canceling pulse.

BRIEF DESCRIPTION OF THE DRAWINGS

These and to other objects and features of the present invention will become clear from the following description taken in conjunction with the preferred embodiment thereof with reference to the accompanying drawings, in which.

DETAILED DESCRIPTION OF THE PREFERRED EMBODIMENTS

Figure 3:
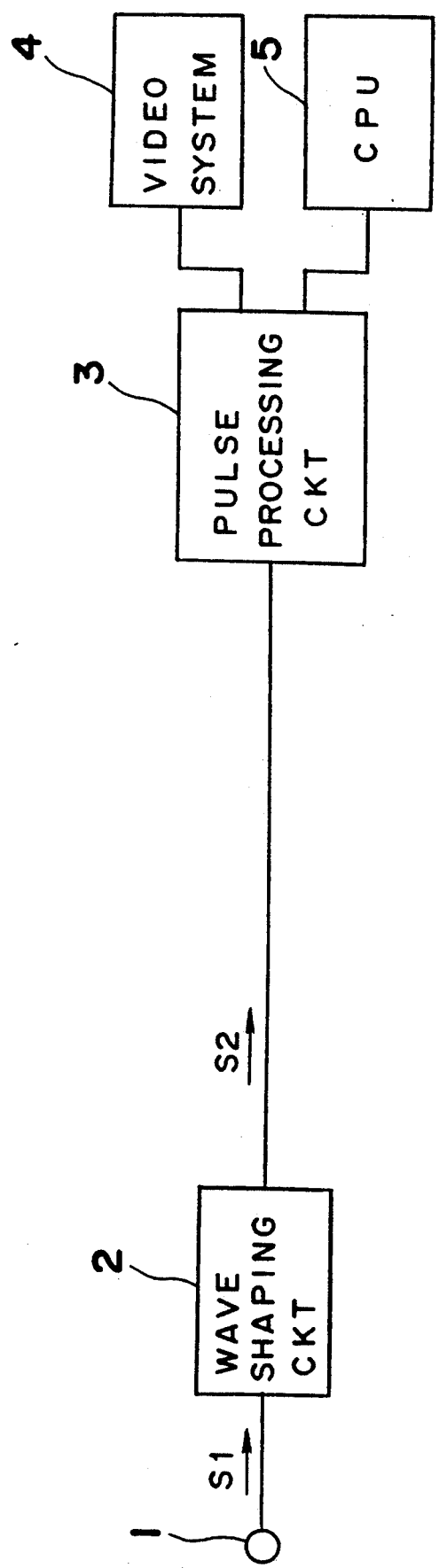
FIG. 3 is a block diagram showing a conventional keying pulse processing configuration.

A preferred embodiment of the present invention will be described hereinbelow with reference to the accompanying drawings. Components of the same constitution as those in the conventional configuration of FIG. 3 will be designated by the same reference number.

Figure 1A:
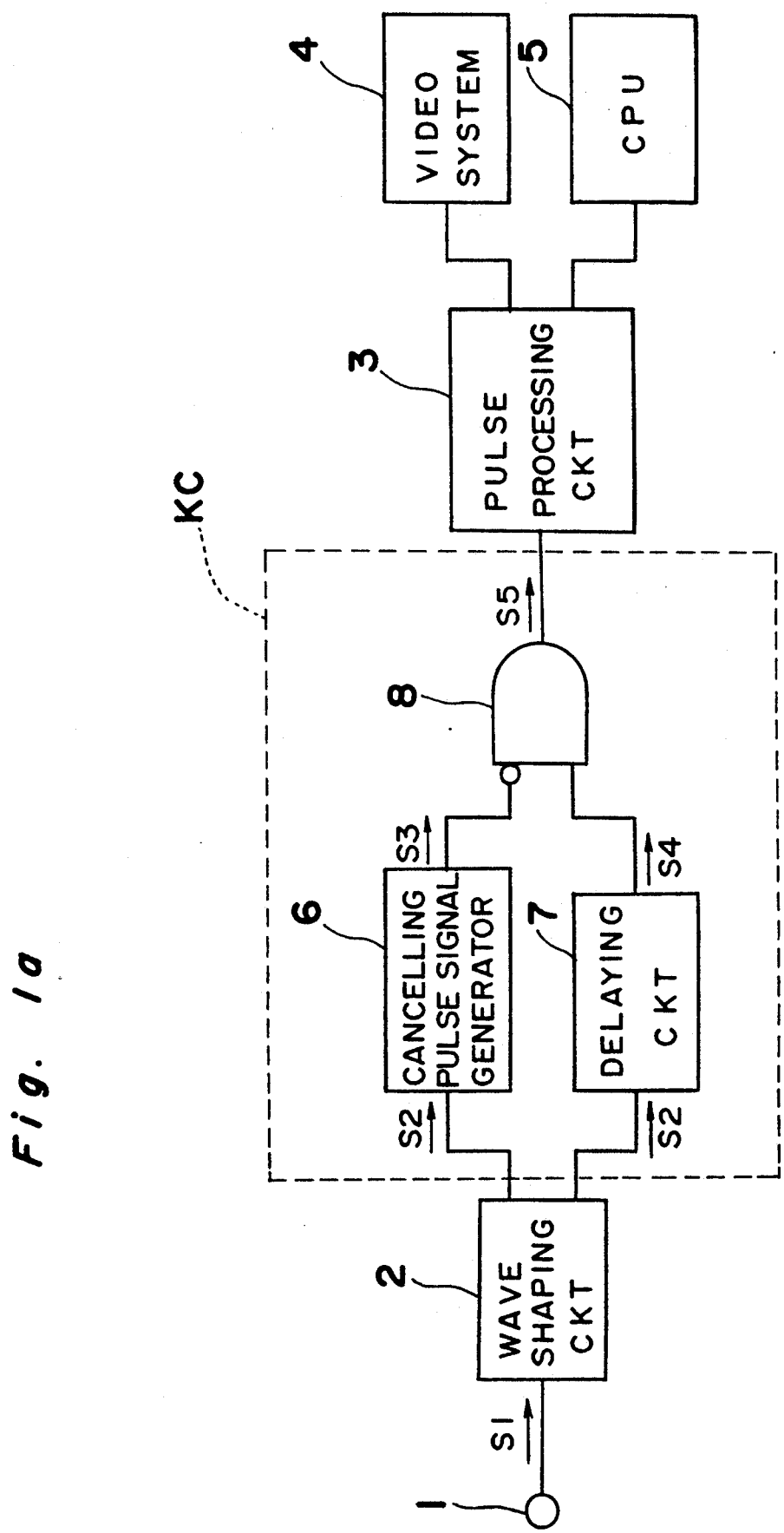
FIG. 1a is a block diagram showing a noise canceler according to a preferred embodiment of the present invention.

Referring to FIG. 1a, a block diagram of a noise canceler according to a preferred embodiment of the present invention is shown. A keying pulse processing circuit KC is provided between a wave shaping circuit 2 and a pulse processing circuit 3. The wave shaping circuit 2 shapes the keying signal S1 transmitted from a terminal 1 into a rectangular wave form signal S2 taking two alternative levels, "1" and "0". The pulse processing circuit 3 processes a noise canceled signal S5 and produces various signals for the following stages of a video system 4 and a CPU 5.

The keying pulse processing circuit KC comprises a canceling pulse signal generator 6 for generating a noise removal pulse signal S3 based on the signal S2, a delaying circuit 7 including a delay circuit, such as a D flip-flop, for delaying the signal S2 by a predetermined time to produce a delay signal S4, and a logic circuit 8. The logic circuit 8 is an AND gate having an inverting input terminal and a non-inverting input terminal for receiving, respectively, the signals S3 and S4, and an output terminal. The logic circuit 8 operates to produce a logical product as a noise canceled signal S5 having alternative sleeve, "0" and "1", in accordance with various combinations of "0" and "1" of the signals S3 and S4, as shown in Table 1, and transmits the produced signal S5 to the pulse processing circuit 3 through the output terminal.

TABLE 1

| (Truth Table of Logic Circuit 8) | | | | |
|---|---|---|---|---|
| S3 | S4 | $\overline{S3}$ | S4 | S5 |
| 1 | 0 | 0 | 0 | 0 |
| 1 | 1 | 0 | 1 | 0 |
| 0 | 0 | 1 | 0 | 0 |
| 0 | 1 | 1 | 1 | 1 |

Figure 1B:
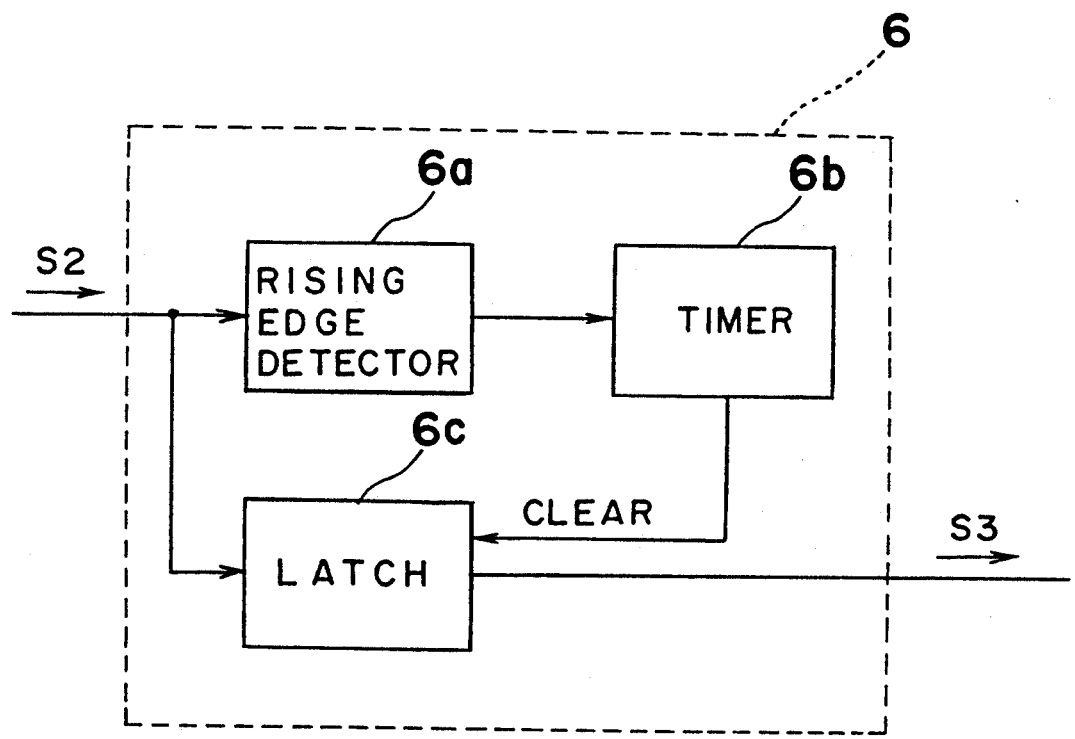
FIG. 1b is a block diagram showing the details of the noise removal pulse generator of the noise canceler of FIG. 1.

Referring to FIG. 1b, a detail of the canceling pulse signal generator 6 is shown. The canceling pulse signal generator 6 includes a leading edge detector 6a for detecting a leading edge of the signal S2 (a leading edge of signal S2 described herein is a rising edge), a digital timer 6b which times a predetermined time period $\tau_1$ in response to the detection of the leading edge by the leading edge detector 6a and produces a clear command at the termination of the predetermined time period, and a latch 6 which latches the signal S2 in response to the receipt of level "1" signal thereof until the clear command is received from the digital timer 6b so as to produce a canceling pulse in the canceling pulse signal S3.

Figure 2:
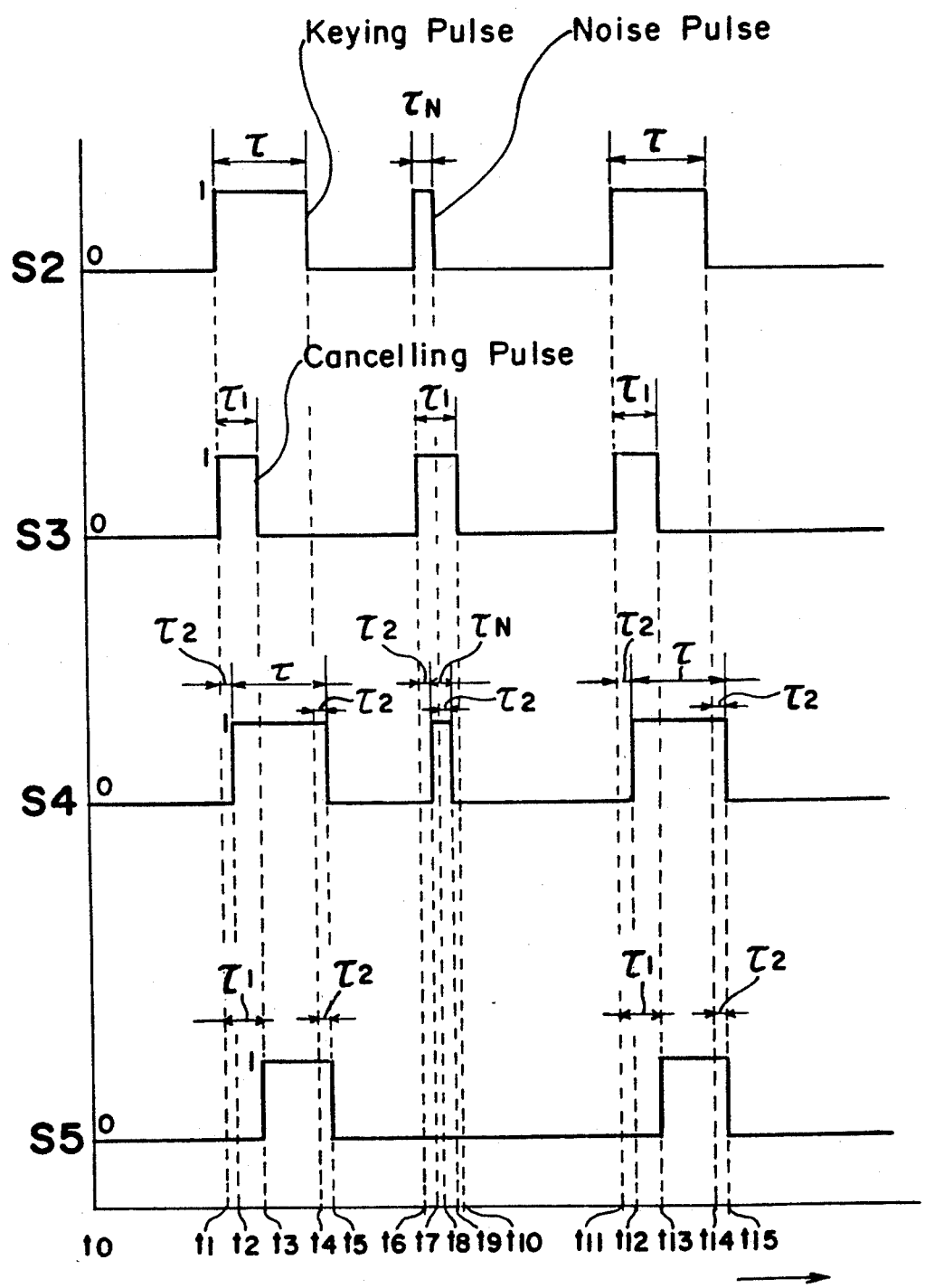
FIG. 2 is a graph showing signals produced and/or processed by the noise canceler of FIG. 1.

In operation, it is assumed that the keying signal S1 includes a noise pulse, and thus, the keying pulse signal S2 produced from the wave shaping circuit 2 has, as shown in FIG. 2, a keying pulse of a pulse width $\tau$ and a noise pulse of a pulse width $\tau_N$. It is to be noted that $\tau$ is greater than $\tau_N$ ($\tau > \tau_N$). The canceling pulse signal generator 6 produces the canceling pulse signal S3 having a plurality of canceling pulses, each produced in response to each pulse in the signal S2 and having a predetermined width $\tau_1$. It is to be noted that $\tau_1$ is smaller than $\tau$ but greater than $\tau_N$ ($\tau > \tau_1 > \tau_N$).

The delaying circuit 7 delays the signal S2 by a predetermined time $\tau_2$ and produces the delayed keying signal S4 so that a keying pulse of a width $\tau$ and a noise pulse of a width $\tau_N$ therein are delayed by a time $\tau_2$ compared with the signal S2. It is to be noted that $\tau_2$ is smaller than the difference between $\tau_1 - \tau_N$ ($\tau_2 \leq \tau_1 - \tau_N$ or $\tau_N \leq \tau_1 - \tau_2$).

The operation of the keying pulse processing circuit KC according to the present invention is further described in connection with FIG. 2.

Before time $t_1$

Because the signal S2 stays at "0", the signals S3 and S4 are both set at "0", according to the Table 1.

From time $t_1$ to $t_2$

At time $t_1$, because the signal S2 changes to "1", the signal S3 is set at "1" in response to the signal S2. However, the signal S4 stays at "0" for the period of $\tau_2$. Therefore, during this period, the signal S5 is set at "0", according to Table 1.

From time $t_2$ to $t_3$

At time $t_2$, i.e. after the time lapse of $\tau_2$ from $t_1$, the signal S4 changes to "1" while the signals S2 and S3 are still at "0". Therefore, the signals S3 and S4 are both at "1", and thus the signal S5 is set at "0", according to Table 1.

From time $t_3$ to $t_4$

At time $t_3$, i.e. after the time lapse of $\tau_1$ from $t_1$, the signal S3 returns to "0", but the signals S2 and S4 stays at "1". Thus the signal S5 is set at "1", according to Table 1.

From time $t_4$ to $t_5$

At time $t_4$, i.e. after the time lapse of $\tau$ from $t_1$, the signals S2 returns to "0", while the signals S3 and S4 remain at "0" and "1", respectively. Therefore, the signal S5 is set at "1", according to Table 1.

From time $t_5$ to $t_6$

At time $t_5$, i.e. after the time lapse of $\tau$ from $t_2$, the signals S2 and S3 are still at "0", and the signal S4 is set at "0". Therefore the signal S5 is set at "0", according to Table 1.

From time $t_6$ to $t_7$

At time $t_6$, because the signal S2 as produced from the wave shaping circuit 2 changes to "1", the signal S3 is set at "1" in response to the signal S2. The signals S2 and S3 stay at "1" for a period of rx representing a noise pulse width and a period of $\tau_1$, respectively. Therefore, the signal S5 is set at "0", according to Table 1.

From time $t_7$ to $t_7$

At time $t_7$, i.e. after the time lapse of $\tau_2$ from $t_6$, the signals S2 and S3 are still at "1", and the signal S4 is set at "1". Therefore, the signal S5 is set at "0", according to Table 1.

From time $t_8$ to $t_9$

At time $t_8$, i.e. after the time lapse of $\tau_N$ from $t_6$, the signal S2 returns to "0", but the signals S3 and S4 remain at "1". Thus, the signal S5 is set at "0", according to Table 1.

From time $t_9$ to $t_{10}$

At time $t_9$, i.e. after the time lapse of $\tau_N$ from $t_7$, the signals S2 and S3 are still at "0" and "1", respectively, but the signal S4 is set at "0". Therefore, the signal S5 is set at "0", according to Table 1.

From time $t_{10}$ to $t_{11}$

At time $t_{10}$, i.e. after the time lapse of $\tau_1$ from $t_6$, the signals S2 and S4 are still at "0", but S3 is set at "0". Therefore, the signal S5 is at "0".

After time $t_{11}$

At time $t_{10}$, because the next keying pulse is produced, the pulses of signals S1, S2, S3, S4 and S5 become the same as that described previously.

As described above, when a noise pulse having a width $\tau_N$ less than the difference between $\tau_1$ and $\tau_2$ ($\tau_N \leq \tau_1 - \tau_2$) is included in the keying signal S1, such a noise pulse is eliminated from the noise canceled keying signal S5 generated by the keying pulse processing circuit KC of the present invention.

According to the above embodiment, the noise canceled signal S5 is delayed by the delay time $\tau_2$, and the leading edge of the keying pulses therein is delayed by an amount of $\tau_1$ when compared with the keying signal S4. In the case where such delays adversely affect the operation, the delay $\tau_2$ can be counterbalanced with a suitable phase advancing device inserted in a transmission system and the problem of the delay $\tau_1$ can be eliminated by using the trailing edge, instead of the leading edge, as a reference for processing the signal in the processing system.

As described hereinabove, it is possible to provide a keying pulse processing circuit KC which can remove the noise pulses having a pulse width less than a predetermined pulse width ($\tau_1 - \tau_2$) with a very simple construction without using a waveform memory or a feedback system. Thus, it is possible to realize a circuit which can operate at a high speed and is suitable for an integrated circuit.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A noise canceler for removing noise pulses from a keying signal defined by a plurality of keying pulses and noise pules, comprising:

a canceling pulse generating means for receiving the keying signal and for generating a canceling pulse signal having a canceling pulse upon each leading edge of each keying pulse and noise pulse of the keying signal, each canceling pulse having a pulse width of a first predetermined time period;

a delaying means for receiving the keying signal and for delaying each keying pulse and noise pulse of the keying signal by a second predetermined time period to generate a delayed keying signal; and, a canceling means for receiving said delayed keying signal from said delaying means and said canceling pulse signal from said canceling pulse generating means, and for generating a noise canceled keying signal having a pulse corresponding to each received pulse of said delayed keying signal except during a time period in which a canceling pulse of said canceling pulse signal is also received;

said canceling pulse generating means including (a) a leading edge detector for detecting a leading edge of each keying pulse and noise pulse of said keying signal, (b) a timer, coupled to said leading edge detector, for generating a clear signal after the lapse of said first predetermined time period from the detection of a leading edge by said leading edge detector, and (c) a latch circuit, coupled to said timer, for latching said keying signal to generate a first level signal at each keying pulse and noise pulse of said keying signal and for clearing in response to said clear signal from said timer to generate a second level signal, said first level signal corresponding to a canceling pulse.

2. A noise canceler as recited in claim 1, wherein said canceling means comprises an AND gate having an inverting input terminal receiving said canceling pulse signal, a non-inverting input terminal receiving said delayed keying signal, and an output terminal for generating a logical product of the inverted canceling pulse signal and the non-inverted delayed keying signal.

* * * * *